United States Patent
Zijstra et al.

(10) Patent No.: US 7,537,969 B2
(45) Date of Patent: May 26, 2009

(54) FUSE STRUCTURE HAVING REDUCED HEAT DISSIPATION TOWARDS THE SUBSTRATE

(75) Inventors: Piebe Zijstra, Middelaar (NL); Ann Killian, Pleasant Valley, NM (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/572,422

(22) PCT Filed: Sep. 18, 2004

(86) PCT No.: PCT/IB2004/051791

§ 371 (c)(1),
(2), (4) Date: Nov. 21, 2006

(87) PCT Pub. No.: WO2005/029582

PCT Pub. Date: Mar. 31, 2005

(65) Prior Publication Data

US 2007/0087543 A1  Apr. 19, 2007

Related U.S. Application Data

(60) Provisional application No. 60/504,390, filed on Sep. 19, 2003.

(51) Int. Cl.
H01L 21/82 (2006.01)

(52) U.S. Cl. ............... 438/132; 438/601; 257/E21.592

(58) Field of Classification Search ........... 438/132, 438/601, 215, 281, 333; 257/529
See application file for complete search history.

(56) References Cited

U.S. PATENT DOCUMENTS

| | | | |
|---|---|---|---|
| 4,198,744 A | | 4/1980 | Nicolay |
| 4,740,485 A | * | 4/1988 | Sharpe-Geisler ............ 438/601 |
| 5,969,404 A | * | 10/1999 | Bohr et al. ................ 257/529 |
| 6,294,474 B1 | | 9/2001 | Tzeng et al. |
| 6,433,404 B1 | * | 8/2002 | Iyer et al. .................. 257/529 |
| 6,525,398 B1 | | 2/2003 | Kim |
| 6,677,226 B1 | * | 1/2004 | Bowen et al. ............... 438/601 |
| 6,828,652 B2 | * | 12/2004 | Kothandaraman ........... 257/529 |
| 2003/0089962 A1 | * | 5/2003 | Anderson et al. ........... 257/529 |
| 2003/0094670 A1 | * | 5/2003 | Hung et al. ................ 257/529 |

* cited by examiner

*Primary Examiner*—Alexander G Ghyka
*Assistant Examiner*—Reema Patel
(74) *Attorney, Agent, or Firm*—Peter Zawilski

(57) ABSTRACT

A fuse structure (100) suitable for incorporation in an integrated circuit presents a reduced thermal conduction footprint to the substrate (103). A patterned material stack (102) is formed on a substrate (103) and at least a portion of a material disposed between the substrate (103) and an upper portion of the fuse structure (100) is selectively etched so as to reduce the thermal conduction pathway between the upper portion and the substrate (103). In a further aspect of the present invention, the reduced cross-section of the fuse structure (100) has an increased current density resulting in a lower amount of current being needed to program the fuse.

11 Claims, 4 Drawing Sheets

FUSE STRUCTURE HAVING REDUCED HEAT DISSIPATION TOWARDS THE SUBSTRATE

CROSS REFERENCE TO RELATED APPLICATION

This application claims the benefit of U.S. provisional application Ser. No. 60/504,390 filed Sep. 19, 2003, which is incorporated herein whole by reference.

The present invention relates generally to electrical circuit elements suitable for incorporation in integrated circuits, and more particularly relates to electrical fuse structures adapted to transfer a reduced amount of heat energy towards the substrate during programming of such fuse structures.

Semiconductor manufacturing processes are used to produce integrated circuits that include a variety of electrical circuit elements. Such circuit elements commonly include, for example, transistors, resistors, capacitors, and diodes. Typical semiconductor manufacturing processes are also capable of producing structures that can act as electrical fuses. Such fuses may be programmed, or "blown", by heating the fuse, typically by conducting a current through the fuse, or by illuminating, and thereby heating, the fuse with a laser beam.

One commonly used fuse structure includes a relatively narrow piece of metal, or other conductive material, disposed on a layer, typically an upper layer, of an integrated circuit, and further includes an opening in a generally overlying passivation layer. Such an opening, or window, in the passivation provides a path for material that is thrown off when the fuse is programmed, or blown.

As indicated above, the typical fuse programming process involves heating and material displacement. Unfortunately, heating and material displacement can affect the reliability of the integrated circuit in which the fuse is incorporated.

What is needed are structures and methods for accommodating the heating due to fuse programming while maintaining an acceptable level of product reliability.

Briefly, a fuse structure suitable for incorporation in an integrated circuit presents a reduced thermal conduction footprint to the substrate. A patterned material stack is formed on a substrate and at least a portion of a material disposed between the substrate and an upper portion of the fuse structure is selectively etched so as to reduce the thermal conduction pathway between the upper portion and the substrate.

Generally, the present invention relates to a fuse structure suitable for use in an integrated circuit, and which, relative to conventional fuse structures, provides a reduced thermal pathway for the transfer of energy into the substrate during the fuse programming process.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Fuses are typically incorporated into an interconnect layer of an integrated circuit during the manufacturing stage of integrated circuit formation. Programming of such fuses is typically done after opening a window in the dielectric layer, or layers, that cover a fuse structure. Programming of the fuse is sometimes referred to as "blowing" a fuse. As part of a programming process, thermal energy, that is heat, is produced by the resistive heating of the fuse as electric current is passed therethrough. The window-openings through the dielectric layer, or layers, overlying the fuse, function as an escape route for the 'blown' interconnect material which forms at least a portion of the fuse structure. The amount of heat dissipated as a result of the fuse programming process is related to the current density used. At least a significant portion of the heat produced during fuse programming is dissipated underneath the blown fuse area into the substrate. Subsequent to the programming of conventional fuse structures, substantial damage, for example, cracking of the substrate/surface area, and surface roughening, has been observed. Such cracking strongly degrades the reliability of the integrated circuit against moisture and sodium penetration, among others.

In accordance with the present invention, by depositing a material stack on a substrate, patterning the material stack to form a fuse structure, and at least partially removing material from a lower portion of the stack, i.e., that portion closer to the substrate, the fuse is provided with a smaller thermal conduction footprint. Such a smaller thermal conduction footprint results in reduced thermal contact between the fuse and the substrate, which is disposed underneath the fuse area. Consequently, the heat transfer path between the fuse structure and the substrate underneath the fuse is substantially reduced. Additionally, by removing at least a portion of the material stack that is close to the substrate, the current density required to blow the fuse is also reduced, and therefore there will be a corresponding reduction in heat dissipation.

Figure 1:
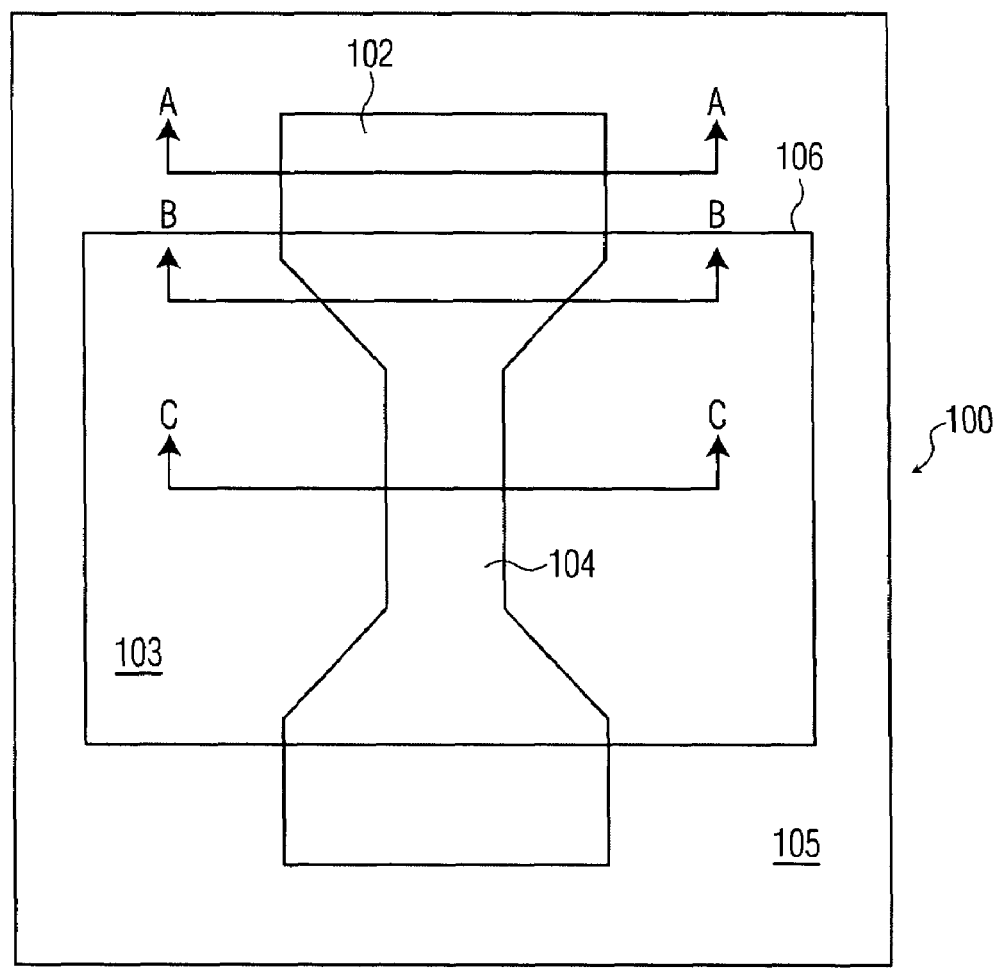
FIG. 1 is a top view of a fuse structure showing the shape of a metal stack, and further showing an opening in a passivation layer overlying the fuse structure.

Referring to FIG. 1, a top view of a fuse structure 100 in accordance with the present invention shows the shape of a metal stack 102 that includes a narrow portion 104, and further shows an opening 106 in a passivation layer 105 overlying fuse structure 100. In this illustrative embodiment, metal stack 102 is comprised of a tungsten layer and an overlying layer of aluminum. The tungsten layer is adjacent an electrically insulating substrate 103 upon which metal stack 102 and the passivation layer are disposed. It is to be understood that various other levels of interconnect, as well as electrical circuit elements may be disposed within substrate 103. In various embodiments of the present invention, substrate 103 represents a semiconductor wafer having previously fabricated portions of integrated circuits thereon, and an upper surface portion that is a dielectric material. Alternatively, substrate 103 may be viewed as the layers of an integrated circuit disposed below an uppermost interconnect level, such as, for example the pad metal layer.

Narrow section 104 of metal stack 102 is provided to increase the current density, and thereby the localized heating, during an electrical fuse programming operation. It is noted that the tungsten layer and the aluminum layer may be selectively etched. That is, the tungsten layer and the aluminum layer may be simultaneously exposed to a tungsten etchant, and the aluminum will be removed, if at all, at a very low rate relative to the rate at which the tungsten is removed. Various embodiments of the present invention utilize at least two layers of material in the fuse structure wherein a first material closer to the substrate surface may be etched selectively with respect to the one or more layers disposed above the first material.

Those skilled in the art of integrated circuits or semiconductor manufacturing will appreciate that metal stack 102 may be formed from more than two layers of material; from two or more layers of material other than tungsten and aluminum; and will further appreciate that the aluminum layer of this illustrative example may alternatively be an aluminum alloy such as, but not limited to, a combination of aluminum and copper. Those skilled in the art of integrated circuits or semiconductor manufacturing will further appreciate that the present invention encompasses any combination of materials suitable for fuse formation, wherein at least one material is in a layer disposed between an upper layer and the substrate, and is selectively etchable with respect to the upper layer. It is noted that the at least one material is also typically selectively etchable with respect to the underlying dielectric layer. It is further noted that the upper layer may be, but is not required to be the uppermost layer of the material stack.

It is noted that in addition to metal stacks, the present invention may alternatively be implemented as a "polycide" stack, i.e., a polycrystalline silicon layer topped with a metal silicide. In the field of semiconductor manufacturing, polycrystalline silicon is sometimes referred to as polysilicon, or even more simply as poly. In an alternative arrangement, amorphous silicon may be used in place of polycrystalline silicon.

Figure 2:
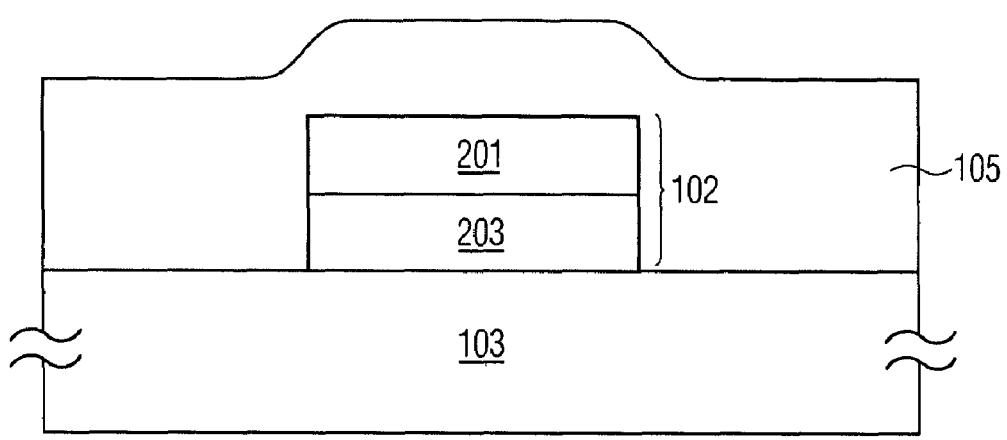
FIG. 2 is a cross-sectional view of the structure of FIG. 1 taken across the line A-A.

FIG. 2 is a cross-sectional view of the structure of FIG. 1 taken across the line A-A. In this illustrative embodiment, metal stack 102 includes a first layer 203 disposed on substrate 103 and a second layer 201 disposed on first layer 203. As can be seen in FIG. 2, this portion of the fuse structure is covered by passivation layer 105. The lower layer 203 in this portion of the fuse structure is not etched subsequent to its initial patterning because it is protected by overlying passivation layer 105. In some embodiments of the present invention, the layer of photoresist used during the opening of the windows in the passivation layer is still present on passivation layer 105 during a selective etch of at least a portion of first layer 203.

Figure 3:
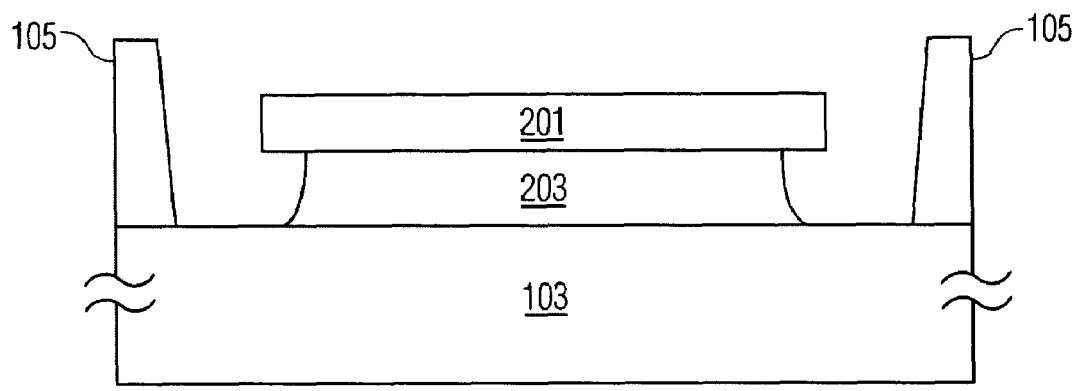
FIG. 3 is a cross-sectional view of the structure of FIG. 1 taken across the line B-B.

FIG. 3 is a cross-sectional view of the structure of FIG. 1 taken across the line B-B. In this portion of the fuse structure, the overlying passivation layer 105 has been etched away to expose layers 201, 203, and substrate 103. As can be seen in FIG. 3, portions of lower layer 203 have been selectively isotropically etched through the opening in passivation layer 105 thereby resulting in undercut regions. Because this portion of metal stack 102 is relatively wider than narrow portion 104 the undercutting etch operation does not typically remove all of first layer 203 at this location in the fuse structure.

Figure 4:
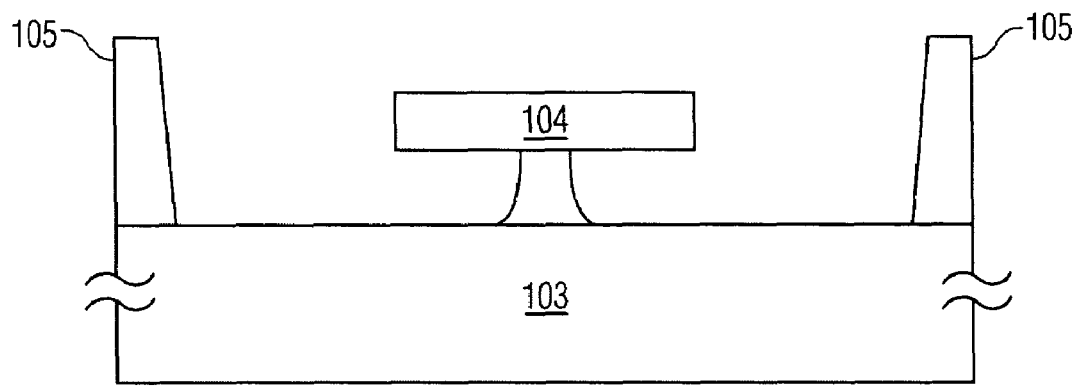
FIG. 4 is a cross-sectional view of the structure of FIG. 1 taken across the line C-C wherein the selective etch of the lower layer leaves a small portion thereof remaining under the upper layer thereby creating substantial gaps between the upper layer and the substrate in the region of highest current density.

FIG. 4 is a cross-sectional view of the structure of FIG. 1 taken across the line C-C wherein the selective etch of the lower layer leaves only a small portion thereof remaining under the upper layer thereby creating substantial gaps between the upper layer and the substrate in the region of highest current density, i.e., narrow portion 104. These gaps substantially reduce the thermal conduction pathway between the upper layer and the substrate.

Figure 5:
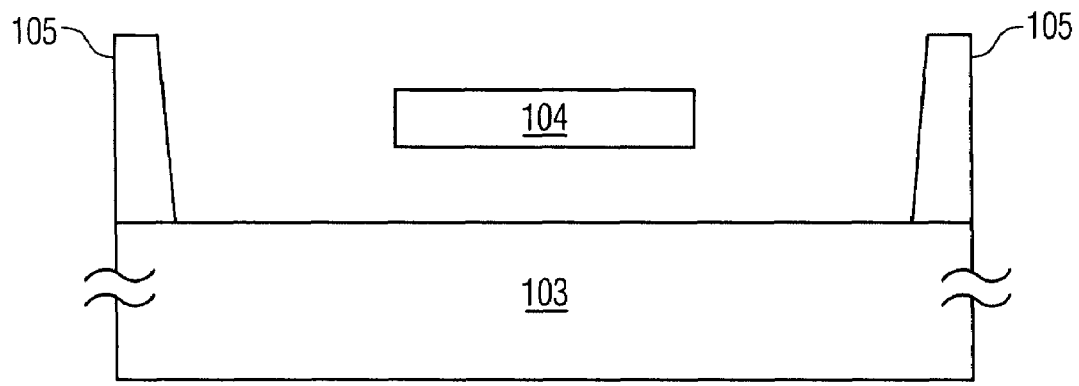
FIG. 5 is a cross-sectional view of the structure of FIG. 1 taken across the line C-C wherein the selective etch of the lower layer removes all of that layer, thereby creating a complete gap between the upper layer and the substrate in the region of highest current density

FIG. 5 is a cross-sectional view of the structure of FIG. 1 taken across the line C-C wherein the selective etch of the lower layer removes all of that layer, thereby creating a complete gap between the upper layer and the substrate in the region of highest current density. Such a complete gap further reduces the thermal conduction footprint as compared to the structure shown in FIG. 4.

Figure 6:
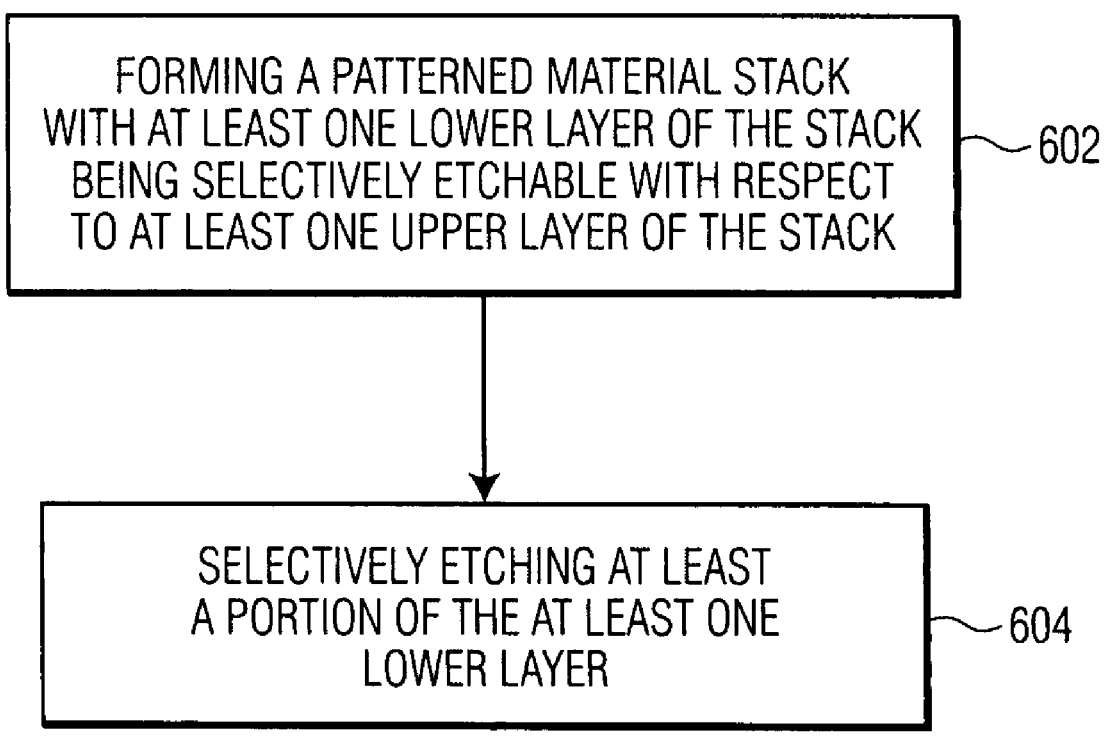
FIG. 6 is a flow diagram illustrating a process for the formation of fuse structure in accordance with the present invention.

FIG. 6 is a flow diagram illustrating a process for the formation of fuse structure in accordance with the present invention. The illustrative process includes forming 602 a patterned material stack with at least one lower layer of the stack being selectively etchable with respect to at least one upper layer of the stack. The illustrative process further includes selectively etching 604 at least a portion of the at least one lower layer. In this way, the lower layer is either partially or completely removed, thereby reducing a thermal conduction pathway between the fuse and the substrate. By reducing the amount of heat conducted into the substrate, the component reliability degradation associated with such a transfer of thermal energy is also reduced.

Figure 7:
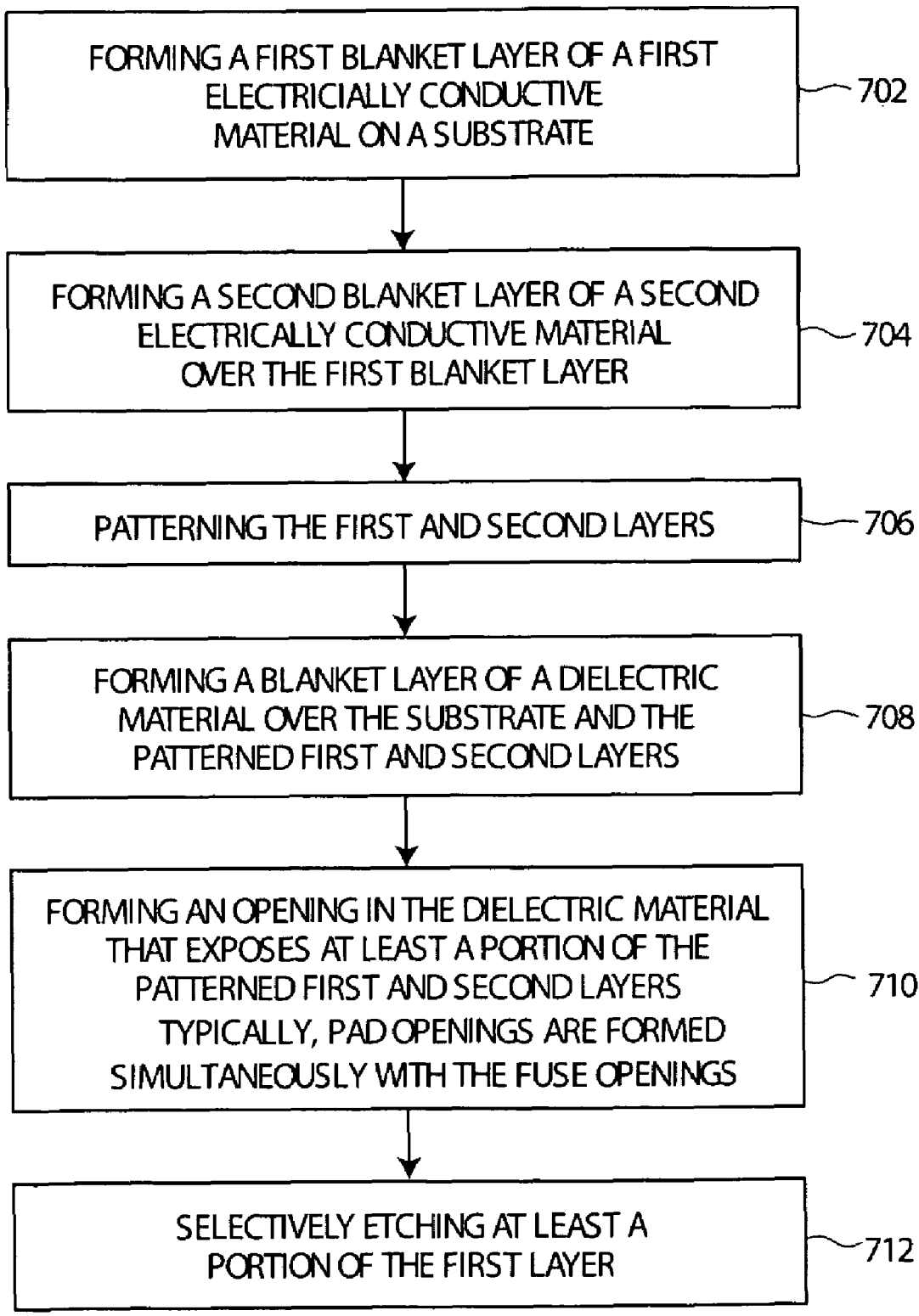
FIG. 7 is a flow diagram illustrating a process for the formation of fuse structure in accordance with the present invention.

FIG. 7 shows a flow diagram illustrating a process for the formation of a fuse structure in accordance with the present invention. The illustrative process includes forming 702 a first blanket layer of a first electrically conductive material on a substrate. In one embodiment, the first electrically conductive material is tungsten, and the substrate is a dielectric material that insulates the first electrically conductive material from other underlying conductive layers of an integrated circuit. Such a dielectric layer (sometimes referred to as an inter-layer dielectric (ILD)) is well known in this field and is not described in greater detail herein. The first conductive material may be formed by any suitable process including, but not limited to, sputtering, evaporation/deposition, chemical vapor deposition, or plasma enhanced chemical vapor deposition. Subsequent to the formation of the first conductive layer, the illustrative process continues by forming 704 a second blanket layer of a second electrically conductive material over the first blanket layer. In one embodiment, aluminum is deposited over the tungsten layer. Together, the first and second layers are referred to a stack. Subsequent to the formation of the multi-layer stack, patterning 706 of the first and second layers is performed so as to produce at least one patterned shape from the blanket layers of conductors. In one embodiment, the metal stack is on the same layer of interconnect as the bonding pads of the integrated circuit.

Patterning of metal lines, or other shapes is well known in the semiconductor manufacturing field. Generally, a photoresist layer is formed over the surface of the integrated circuit, the selected portions of the photoresist are exposed to an energy source, for example, visible light, ultra-violet light, or other higher energy illumination sources such as deep UV, e-beam, extreme UV (i.e., soft X-ray)), to polymerize or depolymerize the photoresist depending on whether, respectively, a negative or positive photoresist is used, and the unpolymerized portions of the photoresist are removed in a developing process. The present invention is not limited to any particular masking technology or process. The portions of the metal stack that underlie the remaining portions of the photoresist are then protected from an etching process which removes the unprotected (i.e., exposed) portions of the metal stack. The metal stack may be removed by any suitable etch process or processes. Such etch processes are generally well known to those skilled in the art, and include, but are not limited to, wet chemical etching and plasma etching. The particular etch chemicals, temperatures, or plasma conditions for etching the metal stack depend upon various well understood factors such as, but not limited to, the chemical composition of the metal or metal alloys in the stack, the thickness of the various layers, the desired removal rate of the etch operation, and so on. It is noted that the metal stack may be etched in multiple steps with each etch step designed to selectively etch the uppermost layer of the stack. In one exemplary plasma etch process a Lam Research TCP9600 series etcher with a fixed gap, a lower electrode temperature of 50° C., and a chamber temperature of 70° C., is used to perform a series of steps, such as, but not limited to, idle; gas-flow/pressure stabilization; break through and/or ARC (i.e., anti-reflective coating) removal; aluminum bulk etch; aluminum over-etch; gas-flow/pressure stabilization; tungsten etch (timed); and wafer transfer. In such an exemplary etch process the aluminum bulk etch may be performed with a Cl2 flow of 60 sccm and a BCl3 flow of 40 sccm at a pressure of 10 mTorr. In such an exemplary etch process the tungsten etch may be performed with a BCl3 flow of 10 sccm and a SF6 flow of 100 sccm at a pressure of 10 mTorr. Those skilled in the art and having the benefit of this disclosure will recognize that there may be other suitable etch recipes for aluminum removal by chlorine and tungsten removal by fluorine. The present invention is not limited to any particular etch recipe.

The illustrative process continues by forming 708 a blanket layer of a dielectric material over the substrate and the patterned first and second layers. In the illustrative example the metal stack is the uppermost layer of interconnect, and the blanket layer of dielectric material is the topside passivation layer. Subsequent to the formation of the topside passivation layer, the illustrative process continues by forming 710 an opening in the topside passivation layer which exposes at least a portion of the patterned first and second layers which represents a fuse structure. Typically, the pad openings are formed simultaneously with the fuse openings. The operation of forming openings in the topside passivation layer may also be referred to as patterning.

In the case where the fuse structure shares the same interconnect level as the bonding pads, the metal stack may be referred to as pad metal, and the mask used to pattern the topside passivation layer may be referred to as the pad mask.

In accordance with the present invention, at least a portion of the first layer is selectively etched 712 so as to create gaps between the upper layer of the metal stack and the underlying substrate thereby reducing the thermal conduction footprint between the high current density portion of the fuse and the substrate. Removal of at least a portion of the first layer in this manner may be referred to as "overetching". It will be appreciated that an isotropic etch of the first layer is performed in typical embodiments of the present invention. In some embodiments substantial gaps are produced by the overetching, while some portion of the first layer remains under the upper layer of the metal stack (as shown in FIG. 4). In still other embodiments the first layer is removed such that a complete gap is formed under the upper layer (as shown in FIG. 5).

It will be appreciated that in typical embodiments of the present invention, the bonding pads, which were formed from the same metal stack as the fuse structures, are not affected by the overetch operation because the pad mask openings are smaller than the dimensions of the bonding pads, and therefore the etchant intended to remove at least portions of the first layer under the fuse structure, does not reach the first layer under the upper portions of the pad metal. However, alternative embodiments of the present invention may implemented wherein the metal stacks comprising bonding pads are also subjected to the undercut etch.

Various embodiments of the present invention include methods and apparatus for improving the reliability of integrated circuits that incorporate fuses. Such fuse structures in accordance with the present invention are suitable for use in integrated circuits generally, and for one time programmable (OTP) memory applications in particular.

An advantage of some embodiments of the present invention, wherein those embodiments provide a fuse incorporated in an integrated circuit, includes a reduction of the thermal energy transferred to the portions of the integrated circuit underlying the fuse, during the electrical programming, or other heating, of the fuse.

An advantage of some embodiments of the present invention, wherein those embodiments provide a fuse incorporated in an integrated circuit, includes a reduction in the physical damage, such as cracking of the surface and/or substrate areas of the integrated circuit, subsequent to the electrical programming, or other heating, of the fuse.

In one exemplary embodiment of the present invention, the reduced cross-section of the fuse structure has an increased current density resulting in a lower amount of current being needed to program the fuse.

It is noted that alternative embodiments in accordance with the present invention are possible. For example, either prior to, or subsequent to, the etching of at least a portion a lower layer of the fuse structure, an alternative embodiment may include etching a portion of the substrate underlying the fuse structure. In this way a trench is formed within the substrate which further reduces the conduction of heat from the fuse programming operation into the substrate.

It is to be understood that the present invention is not limited to the embodiments described above, but encompasses any and all embodiments within the scope of the subjoined Claims.

What is claimed is:

1. A method of manufacturing a fuse structure, comprising:
providing an electrically insulating substrate;
forming a first blanket layer of a first material over the substrate;
forming a second blanket layer of a second material over the first blanket layer;
patterning the second and first layers to form a first patterned structure;
forming a passivation layer over the first patterned structure;
etching an opening in the passivation layer such that a portion of the first patterned structure is exposed; and
isotropically etching at least a portion of the first material within the opening in the passivation layer.

2. The method of claim 1, wherein the electrically insulating substrate comprises an inter-layer dielectric.

3. The method of claim 2, wherein forming a first blanket layer of a first material comprises depositing tungsten over the inter-layer dielectric.

4. The method of claim 3, wherein forming a second blanket layer of a second material comprises depositing aluminum.

5. The method of claim 4, further comprising forming a plurality of bonding pads; etching a plurality of openings in the passivation layer such that each of the plurality of openings is formed over a corresponding one of the bonding pads, and each opening is overlapped by the corresponding bonding pad.

6. A method of forming a fuse structure comprising: forming a patterned material stack with at least one lower layer of the stack being selectively etchable with respect to at least one upper layer of the stack and subsequently selectively etching at least a portion of the at least one lower layer, the method further comprising forming a passivation layer over the material stack and forming an opening in the passivation layer prior to selectively etching at least a portion of the at least one lower layer, wherein the lower layer comprises at least one of polysilicon, amorphous silicon, and tungsten.

7. The method of claim 6, wherein the lower layer comprises a material selected from the group consisting of polysilicon and amorphous silicon; and the upper layer comprises a metal silicide.

8. The method of claim 6, wherein the lower layer comprises tungsten and the upper layer comprises aluminum.

9. A method of manufacturing a fuse structure comprising:
providing an electrically insulating substrate;
forming a first blanket layer of a first material over the substrate;
forming a second blanket layer of a second material over the first blanket layer;
patterning the second and first layers to form a first patterned structure; and
subsequent to patterning the second and first layers, selectively etching at least a portion of the first material; wherein the first material is polysilicon and the second material is a metal.

10. The method of claim 9, further comprising, prior to selectively etching at least a portion of the first material, forming a passivation layer over the patterned structure; and etching an opening in the passivation layer such that a portion of the patterned structure is exposed.

11. The method of claim 10, further comprising forming a plurality of bonding pads; etching a plurality of openings in the passivation layer such that each of the plurality of openings is formed over a corresponding one of the bonding pads, and each opening is overlapped by the corresponding bonding pad.

* * * * *